United States Patent
Song et al.

(10) Patent No.: US 6,399,431 B1
(45) Date of Patent: Jun. 4, 2002

(54) ESD PROTECTION DEVICE FOR SOI TECHNOLOGY

(75) Inventors: Jun Song; Ting Cheong Ang, both of Singapore (SG); Shyue Fong Quek, Petaling Jaya (MY); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/531,786

(22) Filed: Mar. 21, 2000

(51) Int. Cl.[7] .............................................. H01L 21/70
(52) U.S. Cl. ...................... 438/197; 438/157; 438/396; 438/585
(58) Field of Search ................................ 438/197, 585, 438/586, 595, 596, 210, 3, 240, 653, 601, 157, 244, 397; 365/182, 156

(56) References Cited

U.S. PATENT DOCUMENTS

| | | | |
|---|---|---|---|
| 5,141,898 A | | 8/1992 | Lapham ....................... 437/238 |
| 5,166,084 A | * | 11/1992 | Pfiester ......................... 437/40 |
| 5,389,566 A | * | 2/1995 | Lage ............................ 437/52 |
| 5,585,299 A | | 12/1996 | Hsu ............................. 437/56 |
| 5,674,761 A | | 10/1997 | Chang et al. .................. 437/29 |
| 5,716,875 A | * | 2/1998 | Jones, Jr. et al. ............... 438/3 |
| 5,821,160 A | * | 10/1998 | Rodriguez et al. .......... 438/601 |
| 5,872,041 A | * | 2/1999 | Lee et al. ................... 438/397 |
| 5,898,619 A | * | 4/1999 | Chang et al. ............... 365/182 |
| 5,949,706 A | * | 9/1999 | Chang et al. ............... 365/156 |
| 5,960,270 A | * | 9/1999 | Misra et al. ................ 438/197 |
| 6,004,837 A | * | 12/1999 | Gambino et al. ........... 438/157 |
| 6,010,927 A | * | 1/2000 | Jones, Jr. et al. ............ 438/210 |
| 6,238,967 B1 | * | 5/2001 | Shiho et al. ................ 438/244 |

FOREIGN PATENT DOCUMENTS

JP 02000311951 * 11/2000

OTHER PUBLICATIONS

S. Wolf, "Silicon Processing for the VLSI Era", vol. 2: Process Integration, Lattice Press, Sunset Beach, CA, c. 1990, pp. 66–67.

* cited by examiner

*Primary Examiner*—Olik Chaudhuri
*Assistant Examiner*—Laura M Schillinger
(74) *Attorney, Agent, or Firm*—George O. Saile; Rosemary L.S. Pike

(57) ABSTRACT

A method for forming an electrostatic discharge device using silicon-on-insulator technology is described. A silicon-on-insulator substrate is provided comprising a semiconductor substrate underlying an oxide layer underlying a silicon layer. The silicon layer and oxide layer are patterned to form a gate electrode wherein the semiconductor substrate is exposed. Ions are implanted into the exposed semiconductor substrate to form source and drain regions adjacent to the gate electrode. Spacers are formed on sidewalls of the gate electrode. An interlevel dielectric layer is deposited overlying the gate electrode. Openings are formed through the interlevel dielectric layer to the source and drain regions and filled with a conducting layer. The conducting layer is patterned to form conducting lines to complete formation of an electrostatic discharge device using SOI technology in the fabrication of integrated circuits.

18 Claims, 2 Drawing Sheets

ESD PROTECTION DEVICE FOR SOI TECHNOLOGY

BACKGROUND OF THE INVENTION

(1) Field of the Invention

The present invention relates to the fabrication of integrated circuit devices, and more particularly, to a method of forming an electrostatic discharge device using silicon-on-insulator (SOI) technology in the fabrication of integrated circuits.

(2) Description of the Prior Art

Electrostatic discharge (ESD) refers to a high voltage accidentally applied to an integrated circuit. ESD can result from either automated or human handling. If the voltage applied to the gate insulator becomes excessive, the gate oxide can break down. MOSFET devices are particularly vulnerable to ESD damage. Because of this danger, ESD protection transistors are fabricated to direct ESD current away from the circuit it is protecting.

An isolation technology that depends on completely surrounding devices by an insulator is referred to as silicon-on-insulator (SOI) technology. In general, the advantages of SOI technology include simple fabrication sequence, reduced capacitive coupling between circuit elements, and increased packing density. The SOI technology is discussed in *Silicon Processing for the VLSI Era*, Vol. 2, by S. Wolf, Lattice Press, Sunset Beach, Calif., c. 1990, pp. 66–67. The SOI process technology presents a challenge to ESD protection because the presence of the insulator layer (I) sandwiched between the two silicon layers prevents discharging of charges. This may lead to more severe ESD. The present invention overcomes these challenges and uses silicon-on-insulator (SOI) technology to make an electrostatic discharge (ESD) device.

A number of patents present a variety of methods to form ESD devices. U.S. Pat. No. 5,585,299 to Hsu shows a process for forming ESD and FET devices using selective masking processes. U.S. Pat. No. 5,141,898 to Lapham shows a ESD device having a thick oxide formed at low temperature. U.S. Pat. No. 5,674,761 to Chang et al discloses a P/N diode ESD device. None of these patents show an ESD device using SOI technology.

SUMMARY OF THE INVENTION

Accordingly, the primary object of the invention is to provide a process for forming an electrostatic discharge device in the fabrication of integrated circuits.

A further object of the invention is to provide a process for forming an electrostatic discharge device using silicon-on-insulator technology.

In accordance with the objects of the invention, a method for forming an electrostatic discharge device using silicon-on-insulator technology is achieved. A silicon-on-insulator substrate is provided comprising a semiconductor substrate underlying an oxide layer underlying a silicon layer. The silicon layer and oxide layer are patterned to form gate electrodes wherein the semiconductor substrate is exposed between two of the gate electrodes. Ions are implanted into the exposed semiconductor substrate to form source and drain regions adjacent to one of the gate electrodes. Spacers are formed on sidewalls of the gate electrodes. An interlevel dielectric layer is deposited overlying the gate electrodes. Openings are formed through the interlevel dielectric layer to the source and drain regions and filled with a conducting layer. The conducting layer is patterned to form conducting lines to complete formation of an electrostatic discharge device in the fabrication of integrated circuits.

BRIEF DESCRIPTION OF THE DRAWINGS

In the accompanying drawings forming a material part of this description, there is shown.

DESCRIPTION OF THE PREFERRED EMBODIMENTS

FIGS. 1–6 illustrate a process for making a thick oxide ESD device using silicon-on-insulator technology. It should be understood by those skilled in the art that the present invention should not be limited to the embodiment illustrated herein, but can be applied and extended without exceeding the scope of the invention.

Figure 1:
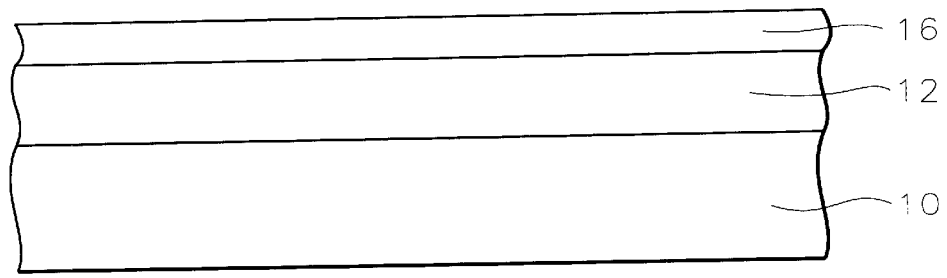
FIGS. 1 through 6 are cross-sectional representations of a preferred embodiment of the present invention.

Referring now more particularly to FIG. 1, there is shown a semiconductor substrate 10. A silicon-on-insulator substrate is fabricated according to any of the conventional methods, and preferably by SIMOX, silicon implant through oxide, or wafer bonding techniques. The resulting SOI substrate comprises a layer of oxide 12 over the silicon substrate 10 having a thickness of between about 1000 and 2000 Angstroms. The thickness of the oxide is important because the oxide will form the gate dielectric of the ESD device. The oxide thickness determines the turn-on voltage of the ESD protection device.

A second silicon layer 16 is epitaxially grown on the oxide layer 12 to a thickness of between about 500 and 3000 Angstroms. The thickness of this silicon layer is important because the silicon layer 16 determines the height of the polysilicon gate of the ESD transistor.

Figure 2:
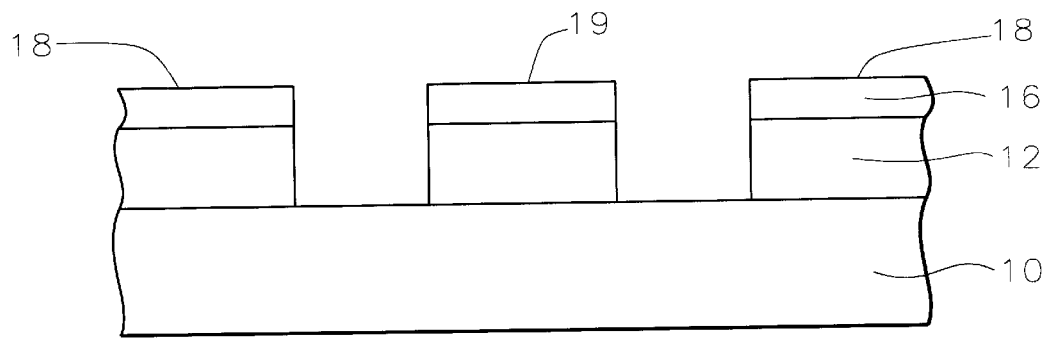
Figure 3:
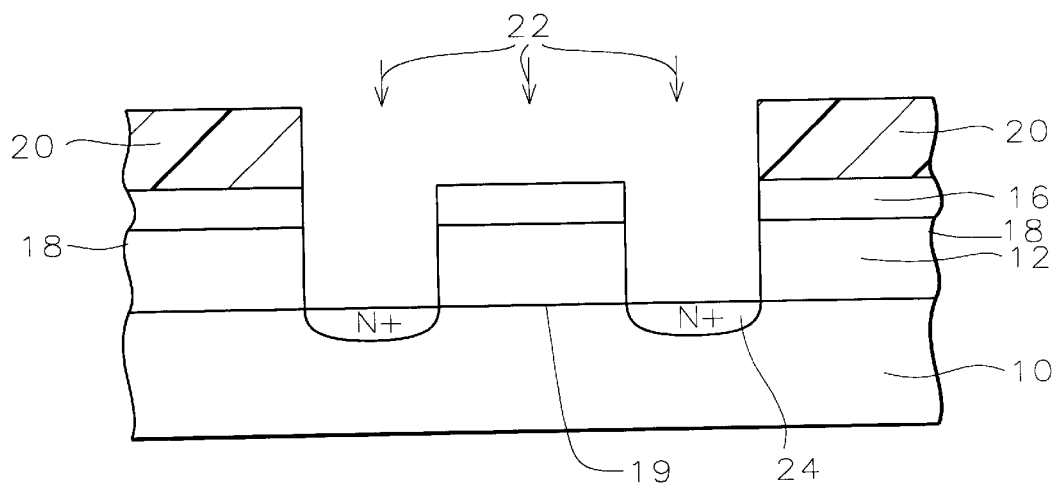

Referring now to FIG. 2, the silicon and oxide layers 16 and 12 are patterned using a gate mask pattern to form gate electrodes 18 and 19, as shown.

Now, an implant mask 20 is formed over the structures to protect the gate electrodes 18 which are not part of the ESD device. Gate electrode 19 will form the ESD device and is exposed to the ion implantation. A source/drain implant 22 is performed through the implant mask. Phosphorus or arsenic ions are implanted into the silicon substrate 10 with an energy of between about 10 and 300 KeV and dosage of between about 1 E 13 and 5 E 15 atoms/cm$^2$ to form N+ regions 24. Ions implanted into the exposed silicon 16 of the gate electrode 19 determines the threshold voltage of the device. Alternatively, p-type implants could be made to form P+ regions rather than N+ regions 24. If P+ regions are to be formed, an N-well must first be formed within the silicon substrate 10. P+ regions are not shown, but it will be understood by those skilled in the art that P+ regions will be formed in the same way as the N+ regions.

Figure 4:
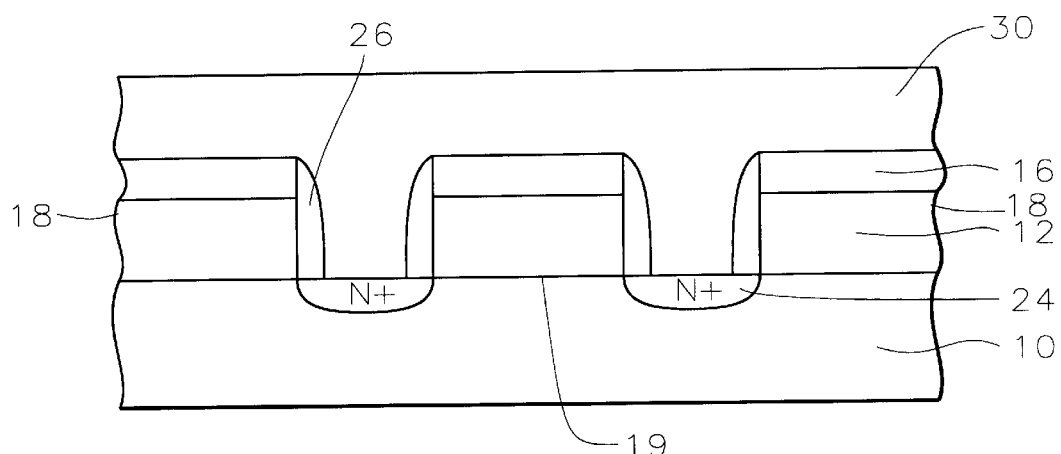

Referring now to FIG. 4, the implant mask 20 is stripped. A layer of silicon nitride is deposited over the structures and etched back anisotropically to form spacers 26 on the sidewalls of the gate electrodes 18 and 19.

Figure 5:
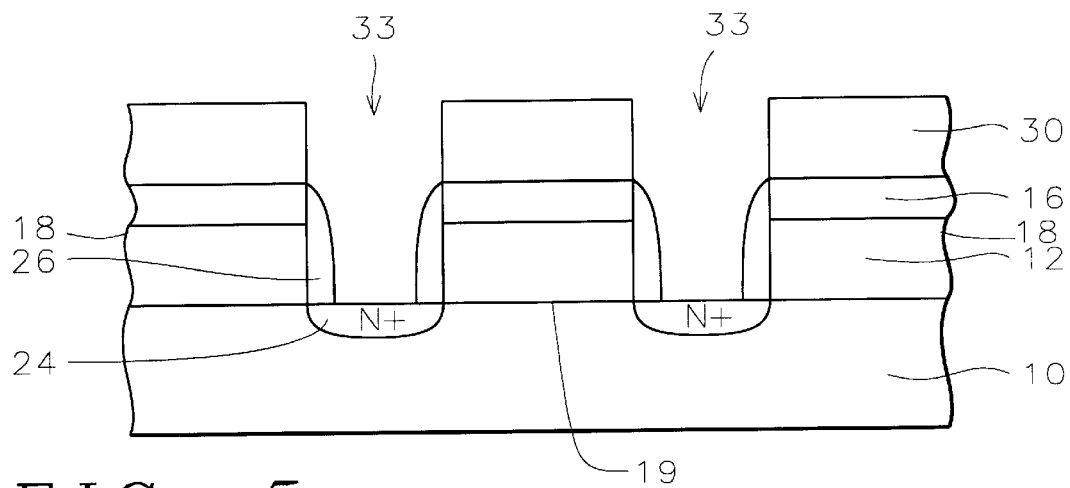

An interlevel dielectric layer (ILD) 30 is blanket deposited over the substrate to a thickness of between about 4000 to 10,000 Angstroms, as shown in FIG. 4. The ILD layer may comprise borophosphosilicate glass (BPSG), fluorine-doped silicate glass (FSG), or undoped silicate glass (USG), for example. Self-aligned contacts (SAC) are etched through the ILD layer 30 to the underlying source/drain regions 24. The spacers 26 comprise a different material than the ILD layer. The openings 35 are etched using an etch chemistry having a high selectivity for the ILD layer material with respect to the spacer material 26. SAC openings 33 are illustrated in FIG. 5.

Figure 6:
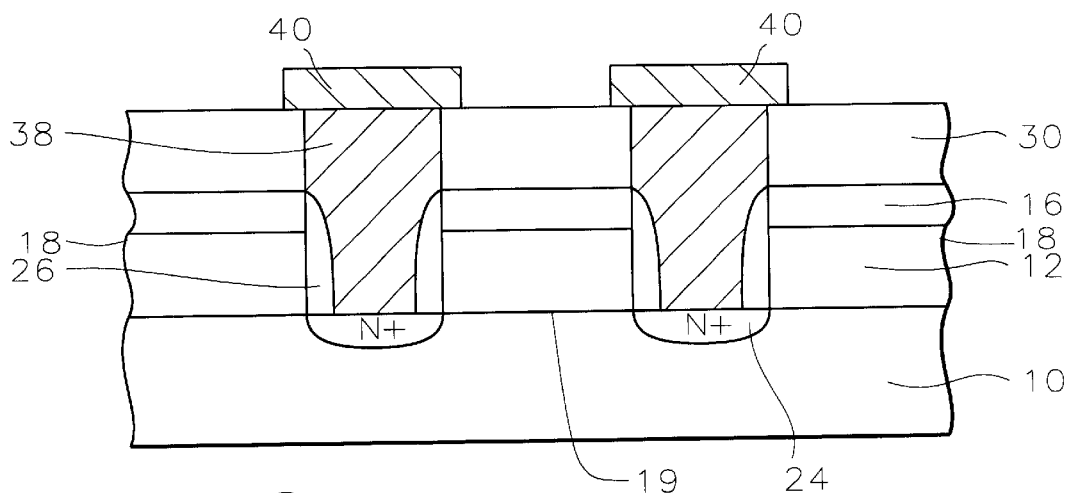

FIG. 6 illustrates the formation of interconnection lines 38/40. A conducting layer, such as AlCu, is deposited over the substrate and within the contact openings. The conducting layer 38 may be etched back to leave plugs 38 followed by deposition and patterning of conducting lines 40. Alternatively, 38 and 40 may be one layer that is deposited over the ILD layer and within the openings and patterned to form connection lines 38/40.

This completes formation of the electrostatic discharge device. The gate electrode 19, source/drain regions 24, and connecting lines 38/40 form the ESD device of the invention.

The process of the present invention results in the formation a thick oxide electrostatic discharge device. The use of silicon-on-insulator technology provides the thick oxide surrounding the gate. The fabrication of the ESD device of the invention is compatible with SOI technology because the insulator of the SOI is used as the gate dielectric of the ESD device. In addition, the fabrication process is simple and compatible with conventional transistor fabrication.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrostatic discharge device in the fabrication of integrated circuits comprising:
   providing a silicon-on-insulator substrate;
   patterning said silicon-on-insulator substrate to form gate electrodes within said silicon-on-insulator substrate wherein a lower portion of said silicon-on-insulator substrate is exposed between each two of said gate electrodes;
   implanting ions into said exposed portion of said silicon-on-insulator substrate to form source and drain regions adjacent to one of said gate electrodes;
   forming spacers on sidewalls of said gate electrodes;
   depositing an interlevel dielectric layer overlying said gate electrodes;
   forming openings through said interlevel dielectric layer to said source and drain regions; and
   filling said openings with a conducting layer and patterning said conducting layer to form conducting lines to complete formation of said electrostatic discharge device in said fabrication of integrated circuits.

2. The method according to claim 1 wherein said gate electrodes have a thickness of between about 1500 and 5000 Angstroms.

3. The method according to claim 1 wherein said step of implanting ions comprises implanting one of the group containing phosphorus and arsenic ions at a dosage of between about 1 E 13 and 5 E 15 atoms/cm$^2$ at an energy of 10 to 300 KeV.

4. The method according to claim 1 wherein said spacers comprise silicon nitride.

5. The method according to claim 1 wherein said interlevel dielectric layer comprises one of the group containing BPSG, FSG, and USG and has a thickness of between about 4000 and 10,000 Angstroms.

6. The method according to claim 1 wherein said conducting layer comprises AlCu.

7. A method of forming an electrostatic discharge device in the fabrication of integrated circuits comprising:
   providing a silicon-on-insulator substrate;
   patterning said silicon-on-insulator substrate to form a gate electrode within said silicon-on-insulator substrate wherein a lower portion of said silicon-on-insulator substrate is exposed;
   implanting ions into said exposed portion of said silicon-on-insulator substrate to form source and drain regions adjacent to said gate electrode;
   forming silicon nitride spacers on sidewalls of said gate electrode;
   depositing an interlevel dielectric layer overlying said gate electrode;
   forming openings through said interlevel dielectric layer to said source and drain regions; and
   filling said openings with a conducting layer and patterning said conducting layer to form conducting lines to complete formation of said electrostatic discharge device in said fabrication of integrated circuits.

8. The method according to claim 7 wherein said gate electrode has a thickness of between about 1500 and 5000 Angstroms.

9. The method according to claim 7 wherein said step of implanting ions comprises implanting one of the group containing phosphorus and arsenic ions at a dosage of between about 1 E 13 and 5 E 15 atoms/cm$^2$ at an energy of 10 to 300 KeV.

10. The method according to claim 7 wherein said interlevel dielectric layer comprises one of the group containing BPSG, FSG, and USG and has a thickness of between about 4000 and 10,000 Angstroms.

11. The method according to claim 7 wherein said conducting layer comprises AlCu.

12. A method of forming an electrostatic discharge device in the fabrication of integrated circuits comprising:
   providing a silicon-on-insulator substrate patterning said silicon-on-insulator substrate to form a gate electrode within said silicon-on-insulator substrate wherein a lower portion of said silicon-on-insulator substrate and wherein the insulator portion of said silicon-on-insulator substrate forms a gate dielectric of said electrostatic discharge device and wherein the silicon portion of said silicon-on-insulator substrate forms a gate of said electrostatic discharge device;
   implanting ions into said exposed portion of said silicon-on-insulator substrate to form source and drain regions adjacent to said gate electrode;
   forming silicon nitride spacers on sidewalls of said gate electrode;
   depositing an interlevel dielectric layer overlying said gate electrode;
   forming openings through said interlevel dielectric layer to said source and drain regions; and
   filling said openings with a conducting layer and patterning said conducting layer to form conducting lines to complete formation of said electrostatic discharge device in said fabrication of integrated circuits.

13. The method according to claim 12 wherein said insulator portion of said silicon-on-insulator substrate has a thickness of between about 1000 and 2000 Angstroms.

14. The method according to claim 12 wherein said silicon portion of said silicon-on-insulator substrate has a thickness of between about 500 and 3000 Angstroms.

15. The method according to claim 12 wherein said step of implanting ions comprises implanting one of the group containing phosphorus and arsenic ions at a dosage of between about 1 E 13 and 5 E 15 atoms/cm$^2$ at an energy of 10 to 300 KeV.

16. The method according to claim 12 further comprising forming an N-well within said semiconductor substrate wherein said step of implanting ions comprises implanting one of the group containing boron and BF$_2$ ions at a dosage of between about 1 E 13 and 5 E 15 atoms/cm$^2$ at an energy of 10 to 300 KeV.

17. The method according to claim 12 wherein said interlevel dielectric layer comprises one of the groups containing BPSG, FSG, and USG and has a thickness of between about 4000 and 10,000 Angstroms.

18. The method according to claim 12 wherein said conducting layer comprises AlCu.

* * * * *